United States Patent
Yoshino et al.

(10) Patent No.: US 12,107,070 B2
(45) Date of Patent: Oct. 1, 2024

(54) WIRE BONDING APPARATUS AND METHOD FOR MANUFACTURING SEMICONDUCTOR DEVICE

(71) Applicant: SHINKAWA LTD., Tokyo (JP)

(72) Inventors: Hiroaki Yoshino, Tokyo (JP); Shinsuke Tei, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 516 days.

(21) Appl. No.: 17/435,696

(22) PCT Filed: Jul. 15, 2020

(86) PCT No.: PCT/JP2020/027421
§ 371 (c)(1),
(2) Date: Sep. 1, 2021

(87) PCT Pub. No.: WO2022/013955
PCT Pub. Date: Jan. 20, 2022

(65) Prior Publication Data
US 2022/0328450 A1    Oct. 13, 2022

(51) Int. Cl.
*H01L 23/00* (2006.01)
(52) U.S. Cl.
CPC .............. *H01L 24/85* (2013.01); *H01L 24/78* (2013.01); *H01L 24/48* (2013.01);
(Continued)
(58) Field of Classification Search
CPC ....................................................... H01L 24/85
See application file for complete search history.

(56) References Cited

U.S. PATENT DOCUMENTS

| 7,067,413 B2 | 6/2006 | Kim et al. |
| 2006/0054665 A1 | 3/2006 | Calpito et al. |

(Continued)

FOREIGN PATENT DOCUMENTS

| JP | 2006222128 | 8/2006 |
| JP | 2006278407 | 10/2006 |

(Continued)

OTHER PUBLICATIONS

Office Action of Taiwan Counterpart Application, with English translation thereof, issued on Aug. 2, 2022, pp. 1-12.

(Continued)

*Primary Examiner* — Yu-Hsi D Sun
(74) *Attorney, Agent, or Firm* — JCIPRNET

(57) ABSTRACT

Provided is a method for manufacturing a semiconductor device which connects a first bond point and a second bond point by a wire. The method includes: a ball bonding step in which a crimping ball and a ball neck are formed at the first bond point by ball bonding; a thin-walled portion forming step in which a thin-walled portion having a reduced cross-sectional area is formed between the ball neck and the crimping ball; a wire tail separating step in which after a capillary is raised to unroll a wire tail, the capillary is moved in a direction to the second bond point, and the wire tail and the crimping ball are separated in the thin-walled portion; and a wire tail joining step in which the capillary is lowered and a side surface of the separated wire tail is joined onto the crimping ball.

5 Claims, 16 Drawing Sheets

(52) U.S. Cl.
CPC ............... *H01L 2224/48465* (2013.01); *H01L 2224/78611* (2013.01); *H01L 2224/78824* (2013.01); *H01L 2224/85201* (2013.01); *H01L 2224/85986* (2013.01)

(56) References Cited

U.S. PATENT DOCUMENTS

| | | | |
|---|---|---|---|
| 2006/0175383 A1* | 8/2006 | Mii | B23K 20/007 228/180.5 |
| 2006/0216863 A1 | 9/2006 | Arakawa | |
| 2009/0194577 A1 | 8/2009 | Mii et al. | |

FOREIGN PATENT DOCUMENTS

| | | |
|---|---|---|
| JP | 4860128 | 1/2012 |
| JP | 2019176111 | 10/2019 |

OTHER PUBLICATIONS

"Office Action of Taiwan Counterpart Application", issued on Jan. 7, 2023, with English translation thereof, p. 1-p. 14.
"International Search Report (Form PCT/ISA/210) of PCT/JP2020/027421," mailed on Oct. 13, 2020, pp. 1-3.

\* cited by examiner

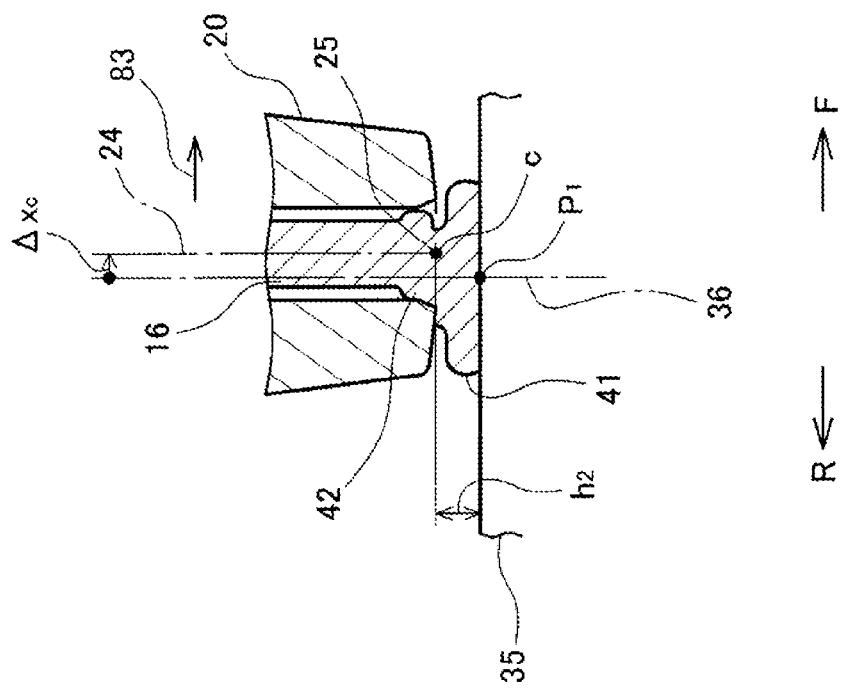

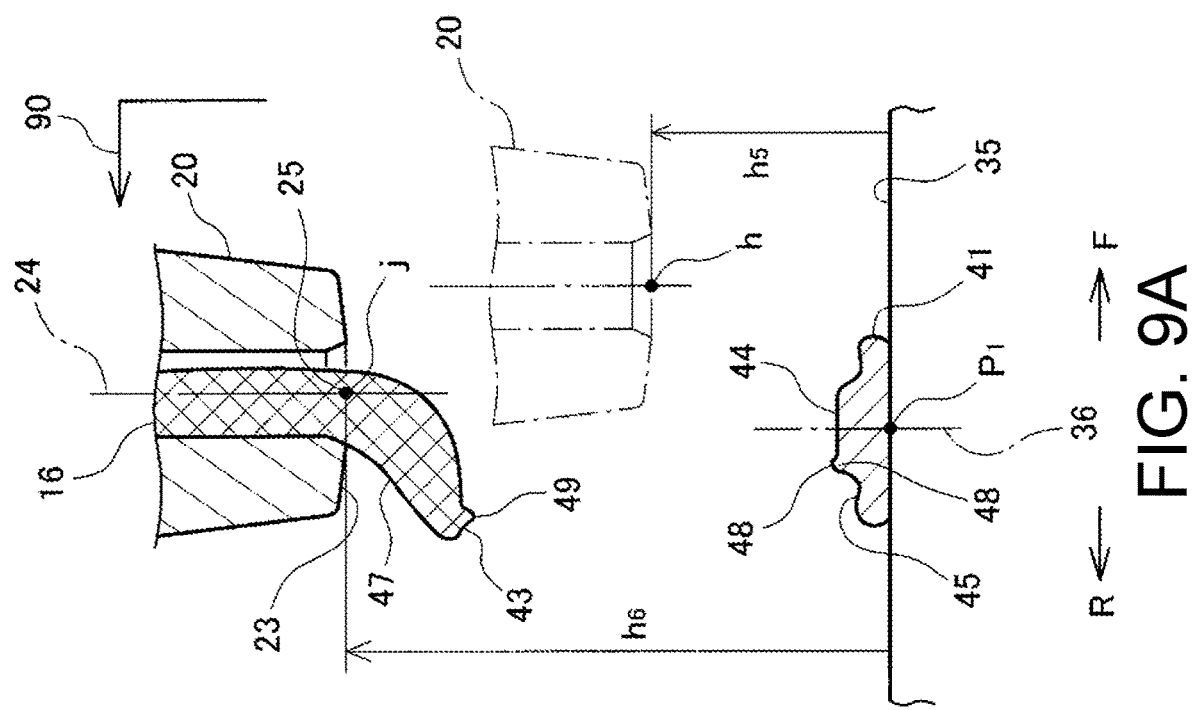

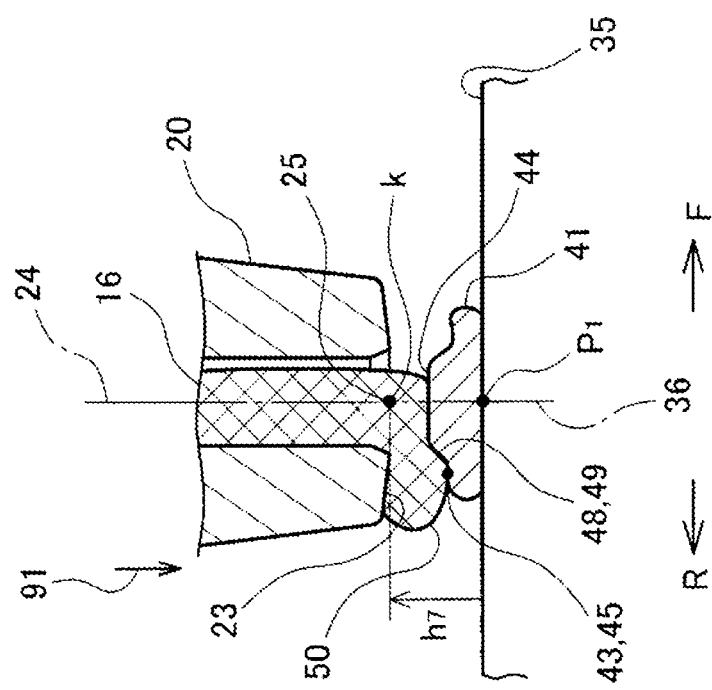

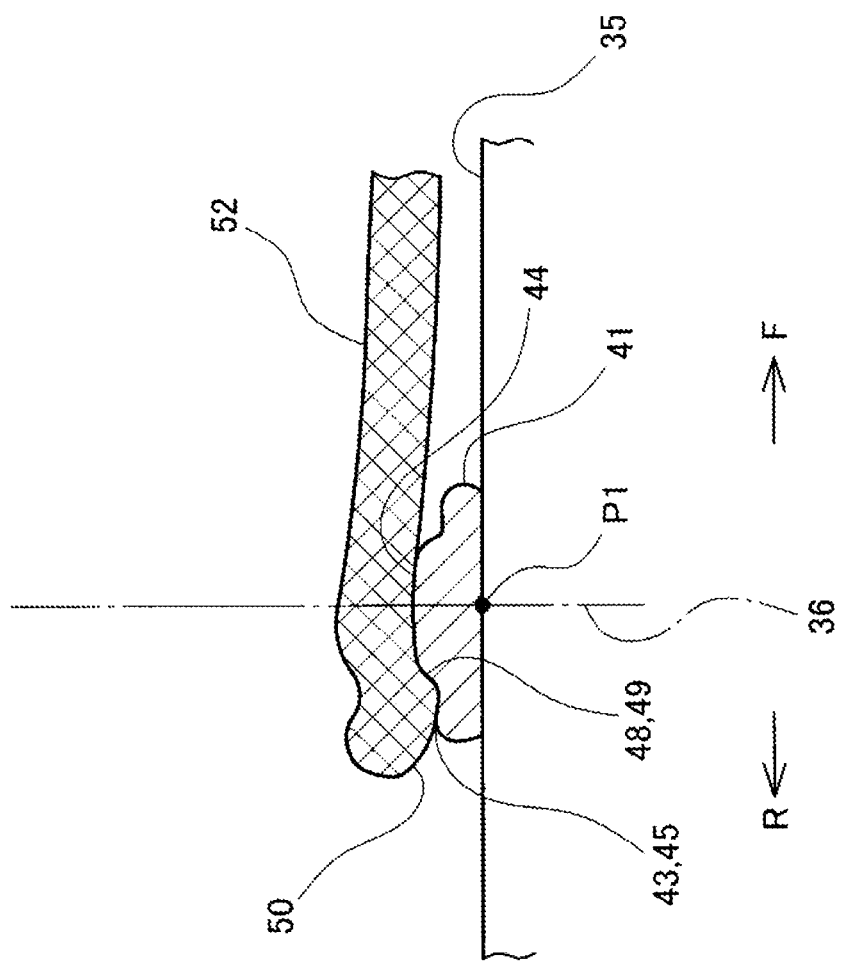

WIRE BONDING APPARATUS AND METHOD FOR MANUFACTURING SEMICONDUCTOR DEVICE

CROSS-REFERENCE TO RELATED APPLICATION

This application is a 371 application of an international PCT application serial no. PCT/JP2020/027421, filed on Jul. 15, 2020. The entirety of the above-mentioned patent application is hereby incorporated by reference herein and made a part of this specification.

BACKGROUND

Technical Field

The present invention relates to a structure of a wire bonding apparatus and a method for manufacturing a semiconductor device using the wire bonding apparatus.

Related Art

In recent years, there has been a demand for thinner semiconductor chips. In order to satisfy this demand, it is necessary to keep a low height of a loop wire formed by wire bonding. Thus, many low-loop technologies for suppressing the loop height have been conventionally proposed.

For example, a bonding method has been proposed in which the loop height is kept low in a manner that after ball bonding is performed, a capillary is raised to extend a wire tail, then the capillary is raised to cut the wire tail, and the cut wire tail is bonded onto a crimping ball (see Patent literature 1 for example).

In addition, a method has been proposed in which the loop height is suppressed in a manner that after ball bonding is performed at a first bond point, a capillary is horizontally moved to scrape off a ball neck above a crimping ball, thereafter, the capillary is raised to extend a wire tail and a side surface of the extended wire tail is pressed onto the crimping ball a plurality of times, and then the capillary is moved toward a second bond point (see Patent literature 2 for example).

LITERATURE OF RELATED ART

Patent Literature

Patent literature 1: Japanese Patent No. 4860128
Patent literature 2: Japanese Patent Laid-Open No. 2019-176111

SUMMARY

Problems to be Solved

However, even if the capillary is raised directly upward to extend and cut the wire tail as in the prior art described in Patent literature 1, because the wire tail is not located under a face portion of the capillary, the wire tail is difficult to join on the crimping ball by the capillary, and there is a problem of realizability.

In addition, in the method of Patent literature 2, a cross-sectional area of the wire tail of the pressed part becomes small, which may limit a loop shape of the wire.

Thus, an object of the present invention is to provide a wire bonding apparatus capable of forming a low loop wire having a great degree of freedom in loop shape.

Means to Solve Problems

A method for manufacturing a semiconductor device of the present invention is a method for manufacturing a semiconductor device in which a first bond point and a second bond point are connected by a wire, and includes: a preparation step for preparing a wire bonding apparatus which includes a capillary through which the wire is inserted and a movement mechanism for moving the capillary; a ball bonding step in which after a free air ball is formed at a distal end of the wire inserted through the capillary, a distal end of the capillary is lowered to a crimping height, the free air ball is joined to the first bond point, and a crimping ball and a ball neck above the crimping ball are formed; a thin-walled portion forming step in which the distal end of the capillary is moved in a horizontal direction, and a thin-walled portion having a reduced cross-sectional area is formed between the ball neck and the crimping ball; a wire tail separating step in which after the capillary is raised to unroll a wire tail, the capillary is moved in a direction to the second bond point, and the wire tail and the crimping ball are separated in the thin-walled portion; and a wire tail joining step in which the capillary is lowered and a side surface of the separated wire tail is joined onto the crimping ball.

By the thin-walled portion forming step, after the thin-walled portion which has a reduced cross-sectional area in the connection part between the ball neck and the crimping ball is formed, the wire tail is separated from the crimping ball, and thus the wire tail can be separated from the crimping ball with a small tensile load. In addition, because the capillary is moved in the direction to the second bond point, and the wire tail and the crimping ball are separated in the thin-walled portion, the cut wire tail enters below the first bond point side of the capillary. Therefore, the side surface of the wire tail can be joined onto the crimping ball, and the loop height can be lowered taking the extending direction of the wire as the horizontal direction.

The method for manufacturing a semiconductor device of the present invention may include a wire tail bending step in which after the thin-walled portion is formed, the capillary is reciprocated in an arc shape in the direction to the second bond point, and the wire is bent and deformed.

Because the wire is bent and deformed in this way, when the wire tail is separated from the crimping ball, the state in which the wire tail enters below the first bond point side of the capillary can be held, the side surface of the wire tail can be reliably joined onto the crimping ball, and the loop height can be lowered.

In the method for manufacturing a semiconductor device of the present invention, in the thin-walled portion forming step, the capillary may be raised to a shear height higher than the crimping height, and the capillary may be moved in the horizontal direction.

Thereby, the ball neck can be reliably deformed to form the thin-walled portion.

In the method for manufacturing a semiconductor device of the present invention, in the thin-walled portion forming step, the capillary may be reciprocated in the horizontal direction when forming the thin-walled portion.

Thereby, the cross-sectional area of the connection part between the ball neck and the crimping ball can be made as small as possible, and variation in the size of the cross-sectional area of the connecting part can be suppressed. As a result, when the wire tail is cut, a shape of the wire tail extending from the distal end of the capillary can be stabilized.

In the method for manufacturing a semiconductor device of the present invention, in the wire tail separating step, when the wire tail is separated from the crimping ball in the thin-walled portion, the capillary may be moved diagonally upward in the direction toward the second bond point.

Thereby, the cut wire tail and the crimping ball can be prevented from coming into contact with each other and being rejoined, and stability of the wire bonding can be improved.

In the method for manufacturing a semiconductor device of the present invention, in the wire tail joining step, when the side surface of the wire tail is joined onto the crimping ball, a face portion of the capillary at the first bond point side may be moved to the above of an end portion of the crimping ball opposite to the second bond point, and then the capillary may be lowered to join the side surface of the bent and deformed wire tail onto the end portion of the crimping ball opposite to the second bond point by the face portion of the capillary.

Thereby, the side surface of the wire tail can be reliably joined onto the crimping ball.

A wire bonding apparatus of the present invention is a wire bonding apparatus which connects a first bond point and a second bond point by a wire, and includes: a capillary through which the wire is inserted; a movement mechanism which moves the capillary; and a control portion which controls drive of the movement mechanism. By the control portion, after a free air ball is formed at a distal end of the wire inserted through the capillary, a distal end of the capillary is lowered to a crimping height, the free air ball is joined to the first bond point, and a crimping ball and a ball neck above the crimping ball are formed; the distal end of the capillary is moved in a horizontal direction, and a thin-walled portion having a reduced cross-sectional area is formed between the ball neck and the crimping ball; after the capillary is raised to unroll a wire tail, the capillary is moved in a direction to the second bond point, and the wire tail and the crimping ball are separated in the thin-walled portion; and the capillary is lowered and a side surface of the separated wire tail is joined onto the crimping ball.

In the wire bonding apparatus of the present invention, by the control portion: after the ball neck is formed, the capillary may be raised to a shear height higher than the crimping height, the capillary may be reciprocated in the horizontal direction, and the thin-walled portion may be formed; after the thin-walled portion is formed, the capillary may be reciprocated in an arc shape in the direction to the second bond point, and the wire may be bent and deformed; when the wire tail is separated from the crimping ball in the thin-walled portion, the capillary may be moved diagonally upward in the direction toward the second bond point; and when the side surface of the wire tail is joined onto the crimping ball, a face portion of the capillary at the first bond point side may be moved to the above of an end portion of the crimping ball opposite to the second bond point, and then the capillary may be lowered to join the side surface of the bent and deformed wire tail onto the end portion of the crimping ball opposite to the second bond point by the face portion of the capillary.

Effect

The present invention can provide a wire bonding apparatus capable of forming a low loop wire having a great degree of freedom in loop shape.

BRIEF DESCRIPTION OF THE DRAWINGS

FIG. 6B is an illustration diagram showing a state in which the capillary is horizontally moved in a forward direction from the state shown in FIG. 6A in the thin-walled portion forming step.

FIG. 9A is an illustration diagram showing a state in which the capillary is moved to the above of a crimping ball in a wire tail joining step when the wire bonding is performed using the wire bonding apparatus according to the embodiment.

FIG. 9B is an illustration diagram showing a state in which the capillary is lowered from the state shown in FIG. 9A and a side surface of the wire tail is joined onto the crimping ball in the wire tail joining step.

FIG. 10 is an illustration diagram showing a first bond portion and the loop wire in a state in which the loop wire is stitch-bonded to the second bond point using the wire bonding apparatus according to the embodiment.

DESCRIPTION OF THE EMBODIMENTS

Figure 1:
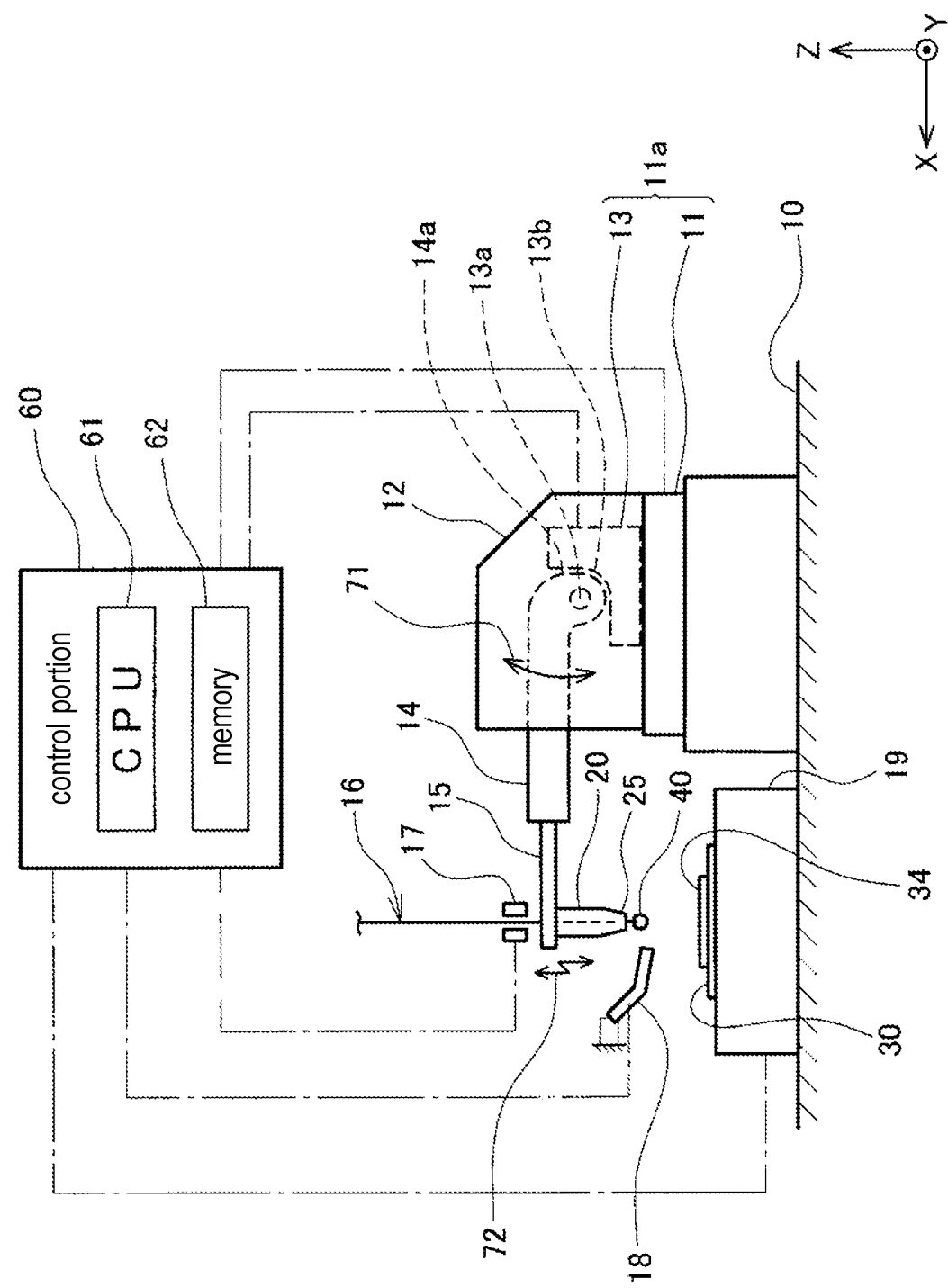
FIG. 1 is an elevational view showing a configuration of a wire bonding apparatus according to the embodiment.

Hereinafter, a wire bonding apparatus 100 of an embodiment is described with reference to the drawings. As shown in FIG. 1, the wire bonding apparatus 100 of the embodiment includes a base 10, an XY-table 11, a bonding head 12, a Z-direction motor 13, a bonding arm 14, an ultrasonic horn 15, a capillary 20, a clamper 17, a discharge electrode 18, a bonding stage 19, and a control portion 60. Moreover, in the following description, a direction in which the bonding arm 14 or the ultrasonic horn 15 extends is described as an X-direction, a direction perpendicular to the X-direction on a horizontal plane is described as a Y-direction, and a vertical direction is described as a Z-direction.

The XY-table 11 is attached on the base 10 to move articles mounted on the XY-table 11 in XY-directions.

The bonding head 12 is attached on the XY-table 11 and is moved in the XY-directions by the XY-table 11. The Z-direction motor 13 and the bonding arm 14 driven by the Z-direction motor 13 are stored in the bonding head 12. The Z-direction motor 13 includes a stator 13b. The bonding arm 14 is a rotor which has a root portion 14a facing the stator 13b of the Z-direction motor 13 and is attached to be rotatable around a shaft 13a of the Z-direction motor 13.

The ultrasonic horn 15 is attached to a distal end of the bonding arm 14 in the X-direction, and the capillary 20 is attached to a distal end of the ultrasonic horn 15. The ultrasonic horn 15 ultrasonically vibrates the capillary 20 attached to the distal end by vibration of an ultrasonic vibrator (not shown). The capillary 20 is equipped with a through hole 21 that penetrates in the vertical direction inside the capillary 20 as will be described later with reference to FIG. 2, and a wire 16 is inserted through the through hole 21.

In addition, the clamper 17 is arranged above the distal end of the ultrasonic horn 15. The clamper 17 opens and closes to grip and release the wire 16.

The discharge electrode 18 is arranged above the bonding stage 19. The discharge electrode 18 may be attached to a frame (not shown) arranged on the base 10. The discharge electrode 18 discharges between the discharge electrode 18 and the wire 16 inserted through the capillary 20 and extending from the distal end 25 of the capillary 20, and melts the wire 16 to form a free air ball 40.

The bonding stage 19 attracts and fixes a substrate 30 on which a semiconductor chip 34 is mounted on an upper surface, and heats the substrate 30 and the semiconductor chip 34 by a heater (not shown).

If the root portion 14a of the bonding arm 14 configuring the rotor is rotated as shown by an arrow 71 in FIG. 1 by an electromagnetic force of the stator 13b of the Z-direction motor 13 on the bonding head 12, the capillary 20 attached to the distal end of the ultrasonic horn 15 is moved in the Z-direction as shown by an arrow 72. In addition, the bonding stage 19 is moved in the XY-directions by the XY-table 11. Thus, the capillary 20 is moved in XYZ-directions by the XY-table 11 and the Z-direction motor 13. Thus, the XY-table 11 and the Z-direction motor 13 configure a movement mechanism 11a for moving the capillary 20 in the XYZ-directions.

The XY-table 11, the Z-direction motor 13, the clamper 17, the discharge electrode 18, and the bonding stage 19 are connected to the control portion 60 and are driven based on commands of the control portion 60. The control portion 60 adjusts a location of the capillary 20 in the XYZ-directions by the movement mechanism 11a configured by the XY-table 11 and the Z-direction motor 13, opens and closes the clamper 17, drives the discharge electrode 18, and controls the heating of the bonding stage 19.

The control portion 60 is a computer including therein a CPU 61 which is a processor that processes information, and a memory 62 which stores an operation program, operation data, and the like.

Figure 2:
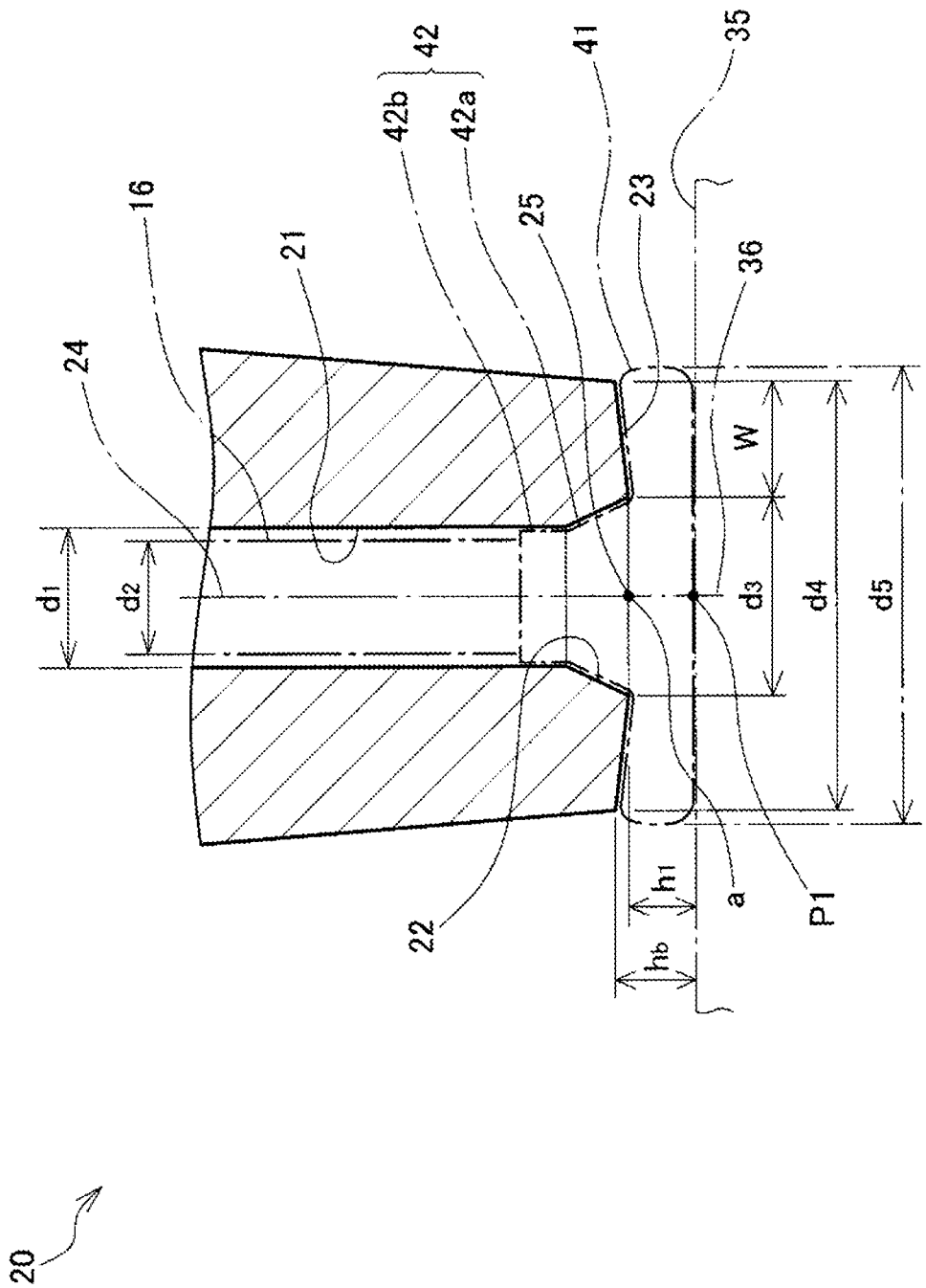
FIG. 2 is a cross-sectional view of a capillary attached to the wire bonding apparatus according to the embodiment.

Next, a structure of the capillary 20 is described with reference to FIG. 2. FIG. 2 is a diagram showing an example of a distal end portion of the capillary 20. The through hole 21 penetrating in the direction of a center line 24 is formed in the capillary 20. The wire 16 is inserted through the through hole 21. Thus, an inner diameter d1 of the through hole 21 is larger than an outer diameter d2 of the wire 16 (d1>d2). A lower end of the through hole 21 expands in a cone-like shape. The tapered portion expanding in the cone-like shape is called a chamfer portion 22. In addition, a maximum diameter of the cone-like space (that is, a diameter at the lowermost end) is called a chamfer diameter d3.

A lower end surface of the capillary 20 is a face portion 23 that presses the free air ball 40 shown in FIG. 1. The face portion 23 may be a flat horizontal plane, or may be an inclined surface that moves upward as approaching the outside. A width of the face portion 23, that is, a distance between the chamfer portion 22 and an outer circumference of the lower end of the capillary 20 is called a "face width W". The face width W is calculated by W=(d4−d3)/2 from the chamfer diameter d3 and an outer diameter d4 of the capillary 20. In addition, in the following description, a point of the lower end of the capillary 20 on the center line 24 is referred to as a distal end 25 of the capillary 20.

As shown by a dot dash line in FIG. 2, when the distal end 25 of the capillary 20 is processed to a point a at a height h1 and the free air ball 40 shown in FIG. 1 is pressed onto the pad 35, the free air ball 40 is pressed by the face portion 23 and flattened to form a flat column-shaped crimping ball 41 having a diameter d5 and a thickness hb. In addition, a part of the metal forming the free air ball 40 enters the through hole 21 from the chamfer portion 22, and a ball neck 42 is formed which is configured by a cone-shaped portion 42a connected to an upper side of the crimping ball 41 and a column-shaped portion 42b connected to an upper side of the cone-shaped portion 42a.

Figure 3:
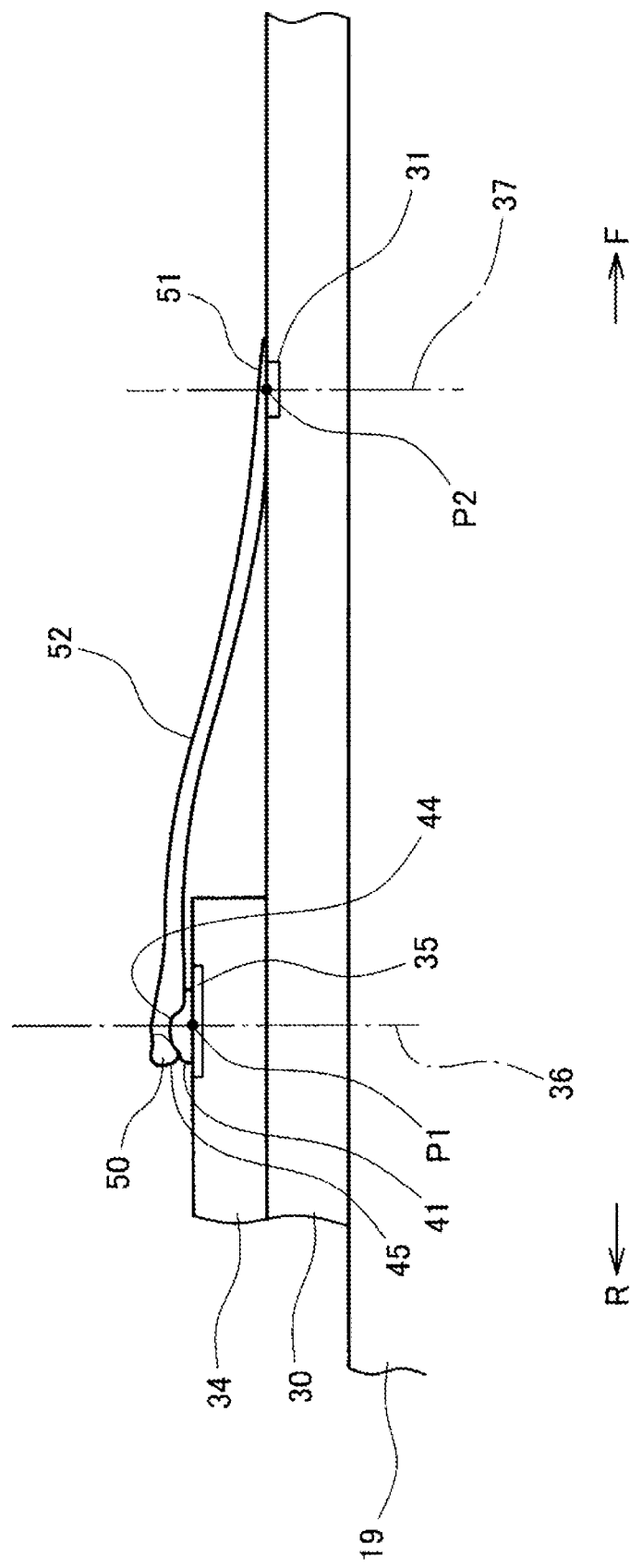
FIG. 3 is an elevational view showing a loop wire formed by the wire bonding apparatus according to the embodiment.

FIG. 3 is an image diagram of a loop wire 52 formed by the wire bonding apparatus 100. A plurality of pads 35 are arranged on the semiconductor chip 34, and a plurality of leads 31 are arranged on the substrate 30. The wire bonding apparatus 100 connects a first bond point P1 located on the pad 35 and a second bond point P2 located on the lead 31 by the loop wire 52.

At the first bond point P1, a first bond portion 50 formed by pressing one end of the wire 16 against the pad 35 is formed, and the loop wire 52 drawn out from the first bond portion 50 extends to the second bond point P2. At the second bond point P2, a second bond portion 51 formed by pressing the other end of the loop wire 52 against the lead 31 is formed. Here, the second bond portion 51 is usually a stitch bond in which the loop wire 52 is pressed against the lead 31 and crushed.

Hereinafter, an operation of forming the first bond portion 50, the loop wire 52, and the second bond portion 51 of the wire bonding apparatus 100 is described with reference to FIGS. 4 to 9B. In the following description, a direction approaching the second bond point P2 when viewed from the first bond point P1 is referred to as a "forward direction", and a direction away from the second bond point P2 or a direction opposite to the second bond point P2 when viewed from the first bond point P1 is referred to as a "reverse direction". The sign "F" shown in each diagram indicates the forward direction, and the sign "R" indicates the reverse direction. In addition, arrows 81 to 91 shown in FIG. 4 correspond to arrows 81 to 91 shown in FIGS. 5 to 9B.

When forming the first bond portion 50, the CPU 61, which is the processor of the control portion 60, first opens the clamper 17, drives and controls the XY-table 11 and the Z-direction motor 13, and moves the distal end 25 of the capillary 20 to the vicinity of the discharge electrode 18. Then, the CPU 61 generates discharge between the discharge electrode 18 and the wire 16 extending from the distal end 25 of the capillary 20, and forms the wire 16 extending from the distal end 25 of the capillary 20 into the free air ball 40.

Figure 4:
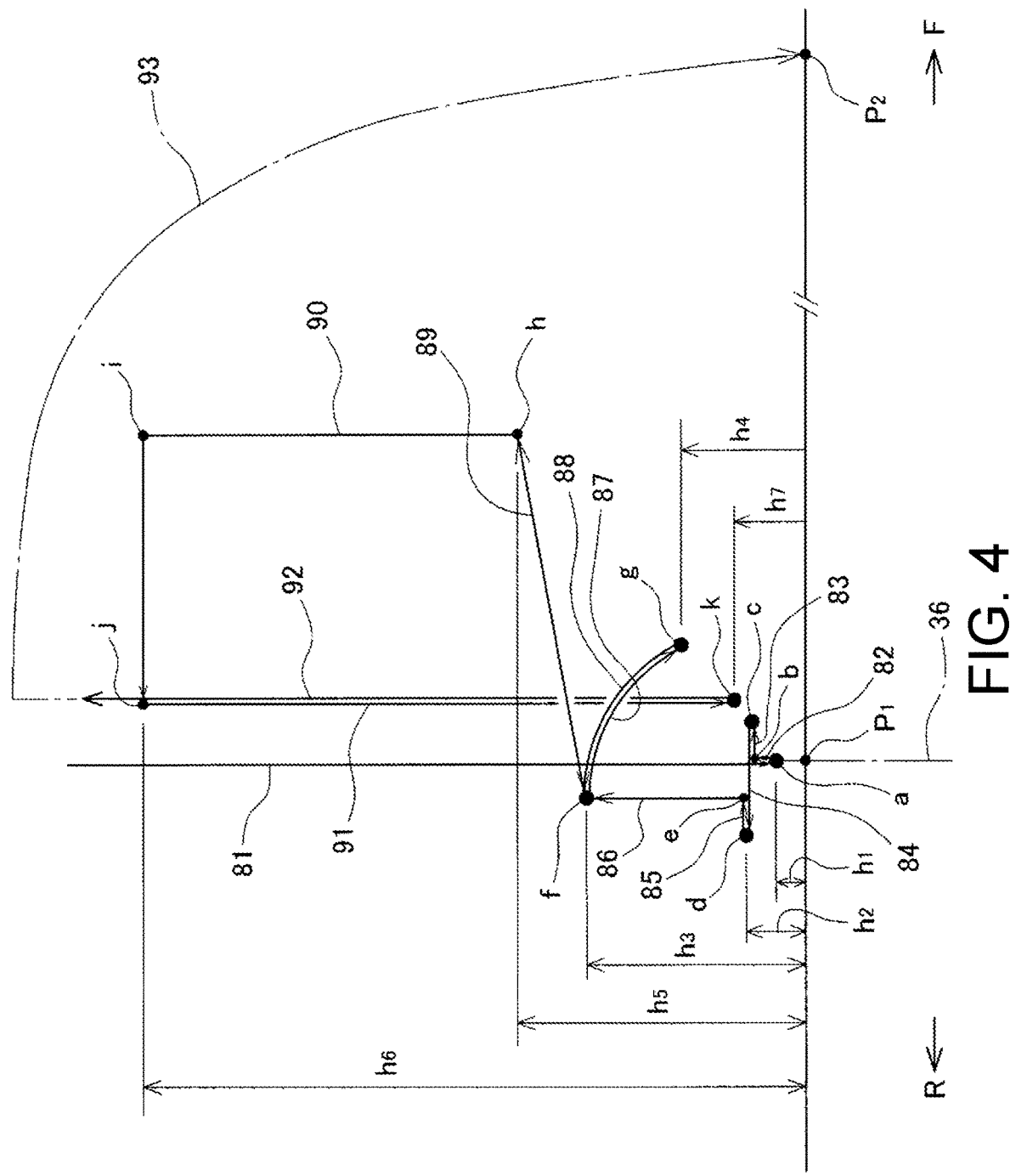
FIG. 4 is an illustration diagram showing movement of a distal end of the capillary.
Figure 5:
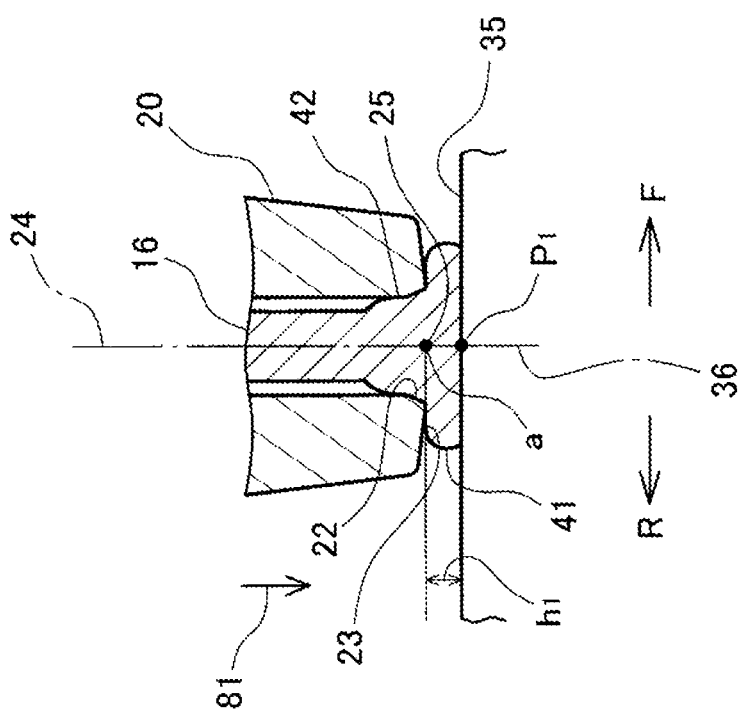
FIG. 5 is an illustration diagram showing a ball bonding step when wire bonding is performed using the wire bonding apparatus according to the embodiment.

Subsequently, the CPU 61 executes a ball bonding step as shown in FIG. 5. As shown in FIG. 4, the CPU 61 aligns XY coordinates of the center line 24 of the capillary 20 with XY coordinates of the center line 36 of the first bond point P1, and as shown by the arrow 81 shown in FIGS. 4 and 5, the distal end 25 of the capillary 20 is lowered toward the first bond point P1 to the point a. At this time, the height h1 from an upper surface of the pad 35 to the distal end 25 of the capillary 20, that is, the height h1 from the upper surface of the pad 35 to the point a is decided based on a target value of the thickness hb of the crimping ball 41 (see FIG. 2). Hereinafter, the height h1 is referred to as the "crimping height h1".

Then, as shown in FIG. 5, the free air ball 40 is pressed onto the pad 35 by the face portion 23 of the capillary 20. At this time, ultrasonic vibration may be applied to the distal end 25 of the capillary 20 via the ultrasonic horn 15.

When the capillary 20 presses the free air ball 40 onto the pad 35, the face portion 23 and the chamfer portion 22 form the free air ball 40 into the crimping ball 41 and the ball neck 42 as described above with reference to FIG. 2. The CPU 61 ends the ball bonding step when the crimping ball 41 and the ball neck 42 are formed.

Figure 6A:
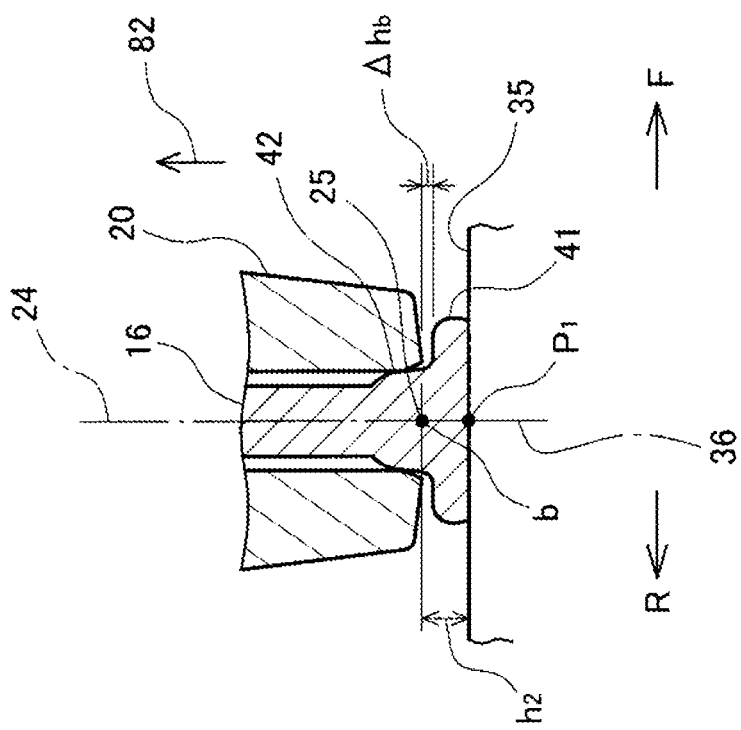
FIG. 6A is an illustration diagram showing a state in which the capillary is slightly raised in a thin-walled portion forming step when the wire bonding is performed using the wire bonding apparatus according to the embodiment.

Next, the CPU 61 executes a thin-walled portion forming step as shown in FIGS. 6A to 6D. The CPU 61 keeps the clamper 17 open. Then, the CPU 61 drives the Z-direction motor 13 as shown in FIG. 6A, slightly raises the distal end 25 of the capillary 20 by a height Δhb to a point b as shown by an arrow 82 shown in FIGS. 4 and 6A, and sets a height of the distal end 25 of the capillary 20 to a height h2. Hereinafter, the height h2 is referred to as the "shear height h2". The shear height h2 is a height between an upper end surface of the crimping ball 41 and an upper end surface of the ball neck 42, and is a height at which the distal end 25 of the capillary 20 is located on a side surface of the ball neck 42.

Next, as shown in FIG. 6B, the CPU 61 drives the XY-table 11 while holding the height of the distal end 25 of the capillary 20 at the shear height h2, and horizontally moves the capillary 20 by a distance Δxc to a point c in the forward direction toward the second bond point P2 as shown by an arrow 83 shown in FIGS. 4 and 6B. Thereby, the center line 24 of the capillary 20 is located closer to the second bond point P2 than the center line 36 of the first bond point P1.

Figure 6C:
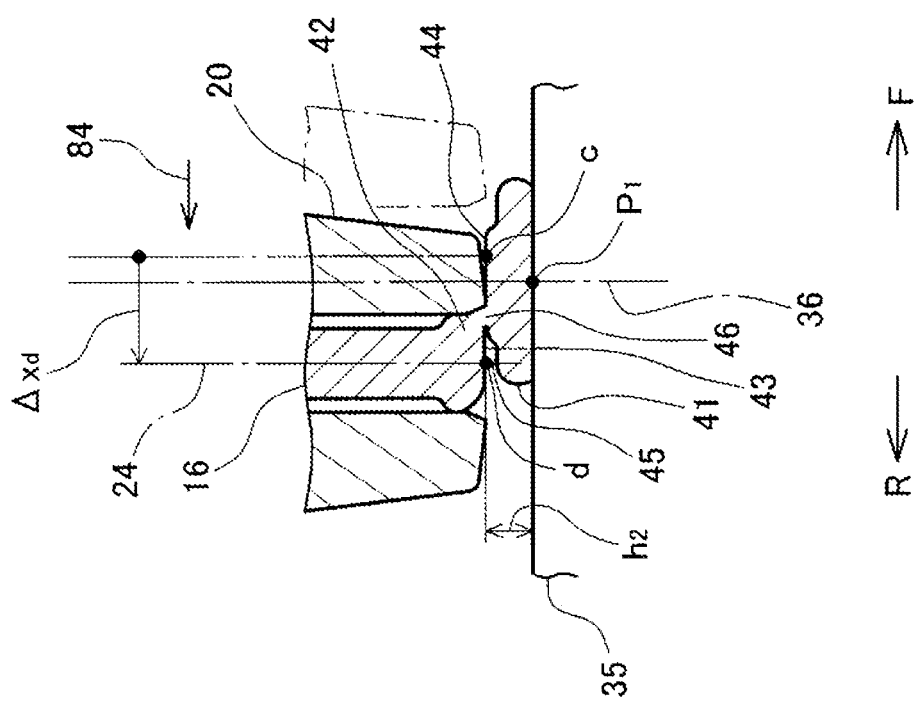
FIG. 6C is an illustration diagram showing a state in which the capillary is horizontally moved in a reverse direction from the state shown in FIG. 6B in the thin-walled portion forming step.

Next, as shown in FIG. 6C, the CPU 61 drives the XY-table 11 in the opposite direction of FIG. 6B while holding the height of the distal end 25 of the capillary 20 at the shear height h2, and horizontally moves the capillary 20 by a distance Δxd to a point d in the reverse direction toward the first bond point P1 from the second bond point P2 as shown by an arrow 84 shown in FIGS. 4 and 6C. Because the Δxd is larger than the Δxc shown in FIG. 6B, the center line 24 of the capillary 20 is on the reverse side of the first bond point P1 as shown in FIG. 6C.

Figure 6D:
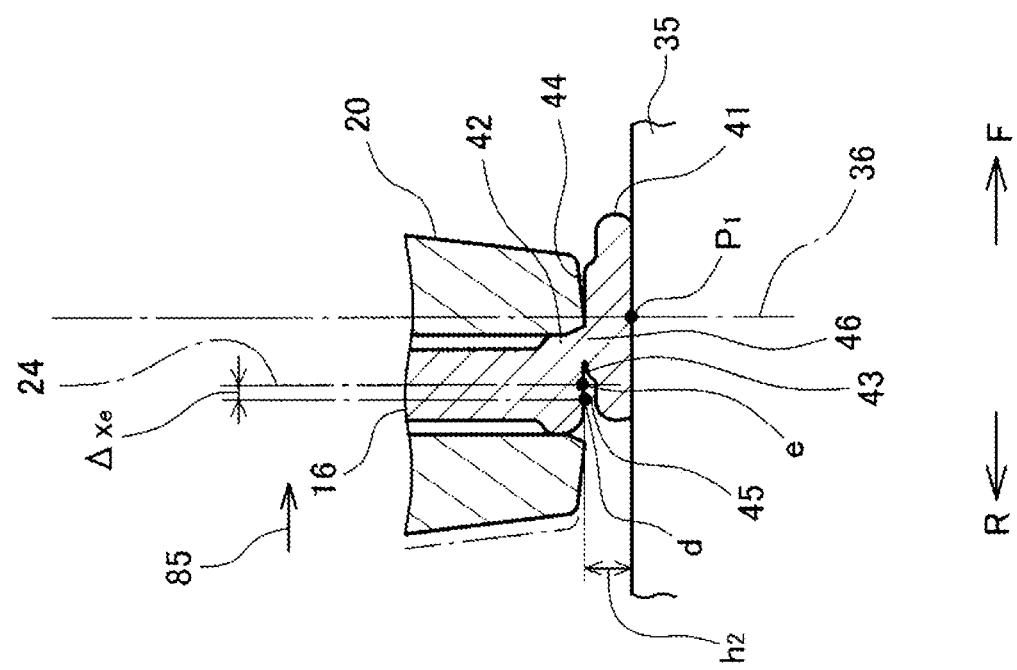
FIG. 6D is an illustration diagram showing a state in which the capillary is horizontally moved slightly in the forward direction again from the state shown in FIG. 6C in the thin-walled portion forming step.

Furthermore, the CPU 61 drives the XY-table 11 while holding the height of the distal end 25 of the capillary 20 at the shear height h2, and horizontally moves the capillary 20 by a distance Δxe to a point e in the forward direction toward the second bond point P2 as shown by an arrow 85 shown in FIGS. 4 and 6D. Because the Δxe is smaller than the Δxd shown in FIG. 6C, as shown in FIG. 6D, the center line 24 of the capillary 20 is on the reverse side of the first bond point P1, and is located to pass through an end portion 45 of the crimping ball 41 on the opposite side (reverse side) of the second bond point P2.

As shown in FIGS. 6B to 6D, when the height of the distal end 25 of the capillary 20 is held at the shear height h2, and the distal end 25 of the capillary 20 is reciprocated toward the forward side and the reverse side in the horizontal direction, as shown in FIGS. 6C and 6D, a part of the ball neck 42 is sheared and broken at the shear height h2 by the distal end 25 of the capillary 20 and is scraped off in the horizontal direction. Thereby, a shear surface 44 on the forward side and a shear surface 43 on the reverse side are formed. Here, the shear surface 44 on the forward side appears near the upper end surface of the crimping ball 41. In addition, the shear surface 43 on the reverse side appears near a lower end surface of the ball neck 42. There is a slight gap between the shear surface 43 and an upper surface of the end portion 45 of the crimping ball 41 on the opposite side (reverse side) of the second bond point P2. A thin connection portion 46 connecting the ball neck 42 and the crimping ball 41 is formed between the shear surface 44 on the forward side and the shear surface 43 on the reverse side. The connection portion 46 is a thin-walled portion having a smaller cross-sectional area than the wire 16.

In this way, when the distal end 25 of the capillary 20 is reciprocated toward the forward side and the reverse side in the horizontal direction, and the shear surfaces 43 and 44 and the connection portion 46 are formed, the cross-sectional area of the connection portion 46 can be made as small as possible, and variation in the size of the cross-sectional area of the connection portion 46 can be suppressed.

Figure 7A:
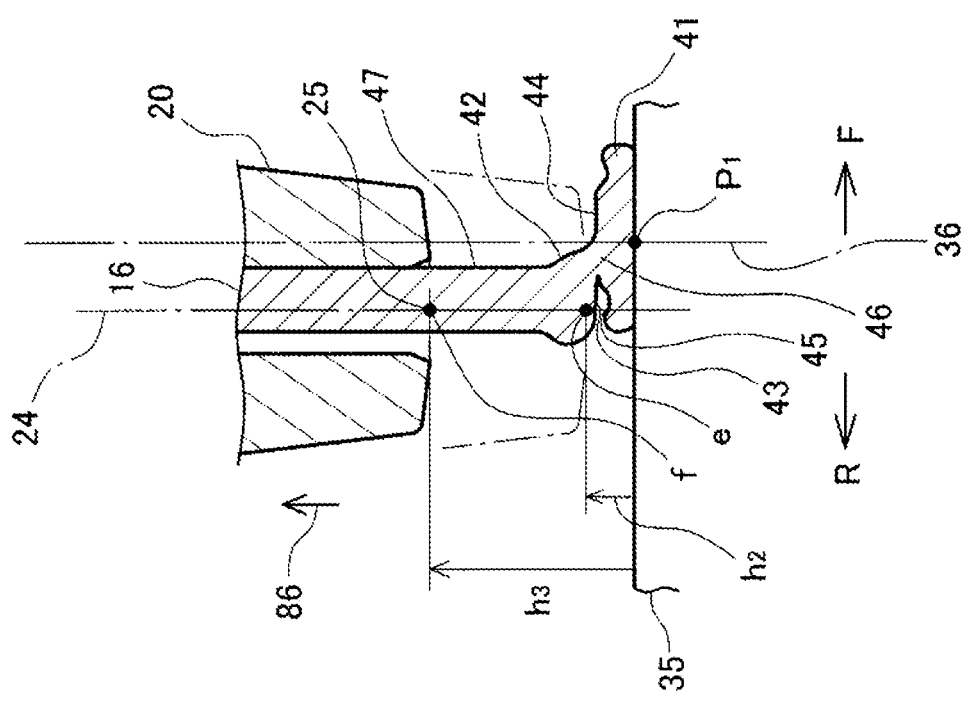
FIG. 7A is an illustration diagram showing a state in which the capillary is raised and a wire tail is extended in a wire tail bending step when the wire bonding is performed using the wire bonding apparatus according to the embodiment.
Figure 7B:
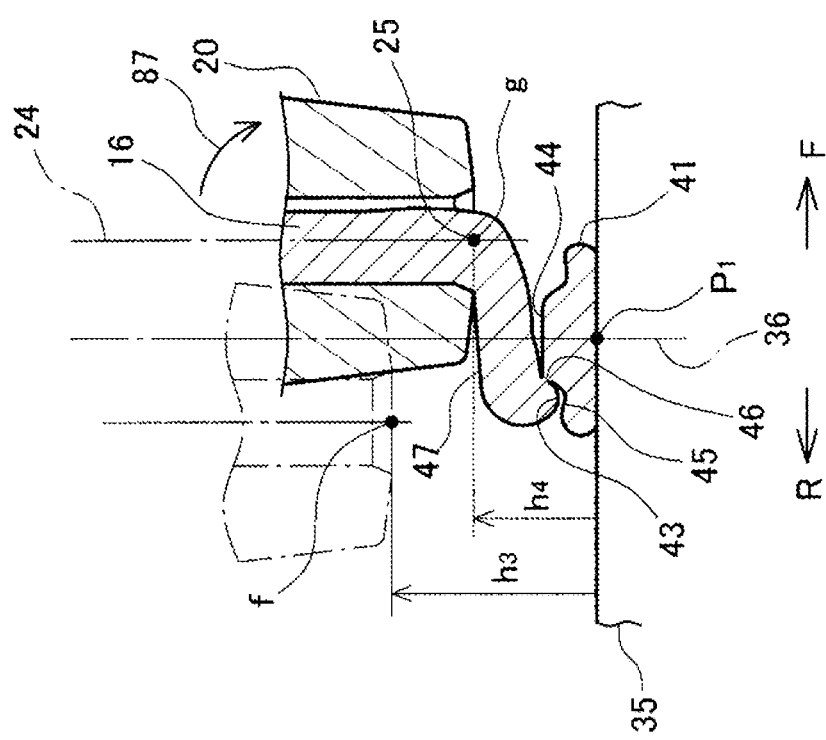
FIG. 7B is an illustration diagram showing a state in which the capillary is moved in an arc shape from the state shown in FIG. 7A toward a second bond point in the wire tail bending step.
Figure 7C:
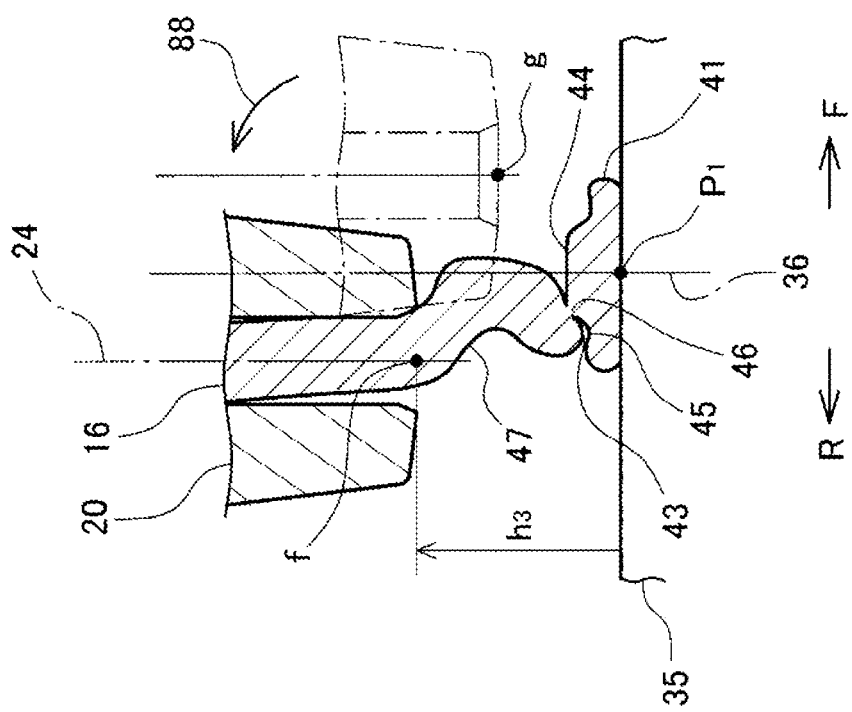
FIG. 7C is an illustration diagram showing a state in which the distal end of the capillary is moved in an arc shape toward a first bond point from the state shown in FIG. 7B in the wire tail bending step.

Next, the CPU 61 executes a wire tail bending step as shown in FIGS. 7A to 7C. The CPU 61 drives the Z-direction motor 13 as shown in FIG. 7A, raises the distal end 25 of the capillary 20 to a point f as shown by an arrow 86 in FIGS. 4 and 7A, and sets the height of the distal end 25 of the capillary 20 to a height h3. Hereinafter, the height h3 is referred to as the "movement height h3". The movement height h3 is higher than the shear height h2. At this time, because the ball neck 42 and the crimping ball 41 are connected by the connection portion 46, and the clamper 17 is open, when the capillary 20 is raised, a wire tail 47 is unrolled from the distal end 25 of the capillary 20.

After the distal end 25 of the capillary 20 is raised to the movement height h3, the CPU 61 moves the distal end 25 of the capillary 20 in an arc shape from the point f to a point g as shown by an arrow 87 shown in FIGS. 4 and 7B. The arc-shaped movement may be carried out to the point g at a height h4 along an arc centered on the point e shown in FIG. 7A and taking the distance between the point f and the point e as a radius. Thereby, the wire tail 47 is bent forward from the connection portion 46, and the lower side surface is bent toward the upper end surface of the crimping ball 41.

Next, contrary to FIG. 7B, the CPU 61 moves the distal end 25 of the capillary 20 in an arc shape from the point g to the point f as shown by an arrow 88 shown in FIGS. 4 and 7C, and returns the location of the distal end 25 of the capillary 20 to the point f. Thereby, the wire tail 47 has a shape curved from the connection portion 46 toward the forward side and then curved toward the reverse side.

Figure 8:
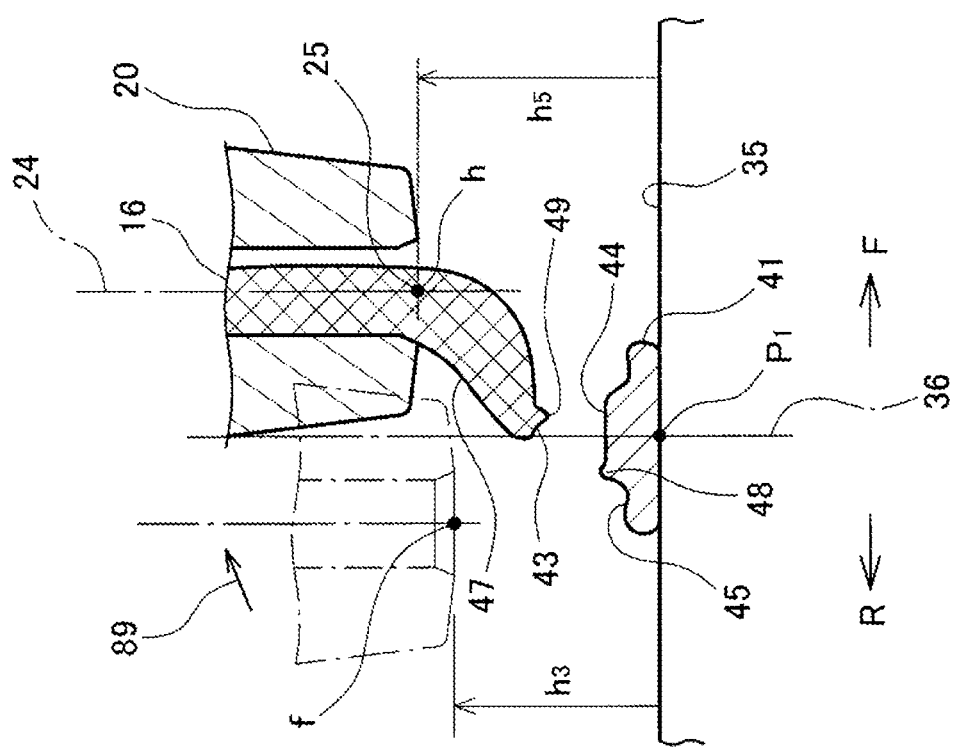
FIG. 8 is an illustration diagram showing a wire tail separating step when the wire bonding is performed using the wire bonding apparatus according to the embodiment.

Next, the CPU 61 executes a wire tail separating step as shown in FIG. 8. As shown in FIGS. 4 and 8, the CPU 61 closes the clamper 17, drives the XY-table 11 and the Z-direction motor 13, and moves the distal end 25 of the capillary 20 diagonally upward in a direction toward the second bond point P2 to a point h at a height h5. Due to this movement, the wire tail 47 extending from the distal end 25 of the capillary 20 is deformed so as to extend diagonally upward from the connection portion 46 in the direction toward the second bond point P2. In addition, because the CPU 61 closes the clamper 17 at the time of the movement, the connection portion 46 is pulled diagonally upward in the direction toward the second bond point P2 by the capillary 20 and the clamper 17 due to the movement. Thereby, as shown in FIG. 8, the connection portion 46 is fractured, and a crimping ball side fracture surface 48 and a wire tail side fracture surface 49 are formed. When the connection portion 46 is fractured, as shown in FIG. 8, the wire tail 47 extends diagonally downward from the distal end 25 of the capillary 20 toward the first bond point P1 toward the reverse side, and wraps around to the lower side of the face portion 23 on the reverse side of the capillary 20.

Next, the CPU 61 executes a wire tail joining step as shown in FIGS. 9A and 9B. As shown by an arrow 90 in FIG. 4, the CPU 61 drives the XY-table 11 and the Z-direction motor 13 to raise the distal end 25 of the capillary 20 from the point h to a point i, and then moves the distal end 25 of the capillary 20 from the point i in the reverse direction. Then, as shown in FIG. 9A, the location of the distal end 25 of the capillary 20 is moved to a point j at a height h6 in order that the face portion 23 on the first bond point side (reverse side) of the capillary 20 is above the end portion 45 on the reverse side of the crimping ball 41.

Next, the CPU 61 lowers the face portion 23 on the reverse side of the capillary 20 toward the end portion 45 on the reverse side of the crimping ball 41 to a point k as shown by an arrow 91 shown in FIGS. 4 and 9B. Then, as shown in FIG. 9B, the side surface of the wire tail 47 extending diagonally downward from the distal end 25 of the capillary 20 toward the reverse side is pressed onto the end portion 45 on the reverse side of the crimping ball 41 by the face portion 23 on the reverse side of the capillary 20. Thereby, the wire tail 47 is joined onto the end portion 45, and the first bond portion 50 is formed. At this time, a height h7 from the upper surface of the pad 35 to the distal end 25 of the capillary 20, that is, a height h7 from the upper surface of the pad 35 to the point k is determined based on a target value of a thickness of the first bond portion 50.

As shown in FIG. 9B, the first bond portion 50 is joined onto the end portion 45 on the reverse side of the crimping ball 41, and the side of the second bond point P2 extends along the shear surface 44 above the crimping ball 41 in the horizontal direction toward the second bond point P2.

Next, the CPU 61 executes a stitch bonding step. The CPU 61 opens the clamper 17, raises the capillary 20 as shown by an arrow 92 shown in FIG. 4, and extends the loop wire 52 from the distal end 25 of the capillary 20. Thereafter, as shown by an arrow 93 of a dot dash line shown in FIG. 4, the CPU 61 loops the distal end 25 of the capillary 20 and aligns the location of the center line 24 of the capillary 20 with a location of a center line 37 (see FIG. 3) of the second bond point P2. Then, the distal end 25 of the capillary 20 is pressed onto the lead 31 of the substrate 30 and the side surface of the loop wire 52 is stitch-bonded onto the lead 31 to form the second bond portion 51.

Thereby, as shown in FIGS. 3 and 10, the loop wire 52 has a shape that extends in the horizontal direction toward the second bond point P2 beyond the above of the shear surface 44 of the crimping ball 41 from the first bond portion 50 which is joined onto the end portion 45 on the reverse side of the crimping ball 41.

Note that, although the locus of the looping of the distal end 25 of the capillary 20 is described in a simplified manner in FIG. 4, various paths may be used depending on the shape of the loop wire 52 to be formed.

Thereafter, the CPU 61 closes the clamper 17 and raises the capillary 20 to cut the wire 16. In this way, the wire bonding apparatus 100 connects the first bond point P1 and the second bond point P2 shown in FIG. 3 by the first bond portion 50, the loop wire 52, and the second bond portion 51.

As described above, in the wire bonding apparatus 100 of the embodiment, after the cross-sectional area of the connection portion 46 between the ball neck 42 and the crimping ball 41 is reduced by the thin-walled portion forming step, the wire tail 47 is bent and deformed, and the capillary 20 is moved toward the second bond point P2 to cut the wire tail 47 from the crimping ball 41. Thus, a state in which the cut wire tail 47 enters the lower side of the face portion 23 on the reverse side of the capillary 20 can be held. Therefore, when the side surface of the wire tail 47 is joined onto the crimping ball 41 to form the first bond portion 50, the second bond point side of the first bond portion 50 can extend toward the second bond point P2 in the horizontal direction along the above of the crimping ball 41. Therefore, as shown in FIGS. 3 and 10, the loop wire 52 can be formed so as to be horizontally oriented toward the second bond point P2 from above the crimping ball 41, and the height of the loop wire 52 can be lowered.

In addition, as in the prior art described in Patent literature 2, even if the side surface of the wire tail 47 is not pressed onto the crimping ball 41a plurality of times, the second bond point side of the first bond portion 50 can extend toward the second bond point P2 in the horizontal direction along the above of the crimping ball 41. Therefore, because the cross-sectional area of the connection part between the first bond portion 50 and the loop wire 52 can be made larger than that in the prior art, the distal end 25 of the capillary 20 can be freely moved in the stitch bonding step, and the degree of freedom in the shape of the loop wire 52 can be increased.

In addition, in the wire bonding apparatus 100 of the embodiment, in the thin-walled portion forming step, the distal end 25 of the capillary 20 is reciprocated in the horizontal direction toward the forward side and the reverse side to make the cross-sectional area of the connection portion 46 as small as possible, and the variation in the size of the cross-sectional area of the connection portion 46 is suppressed. Therefore, in the wire tail separating step, a breaking load between the wire tail 47 and the connection portion 46 is small and constant, and thus when the connection portion 46 is fractured, the shape of the wire tail 47 that enters the lower side of the face portion 23 on the reverse side of the capillary 20 does not vary and is stable. Thereby, the shape of the first bond portion 50 formed on the end portion 45 on the reverse side of the crimping ball 41 becomes constant, and stable wire bonding can be performed.

Furthermore, in the wire bonding apparatus 100 of the embodiment, in the wire tail separating step, the distal end 25 of the capillary 20 is moved diagonally upward in a direction toward the second bond point P2, and thus the cut wire tail 47 and the crimping ball 41 can be prevented from coming into contact with each other and being rejoined, and the stability of wire bonding can be improved.

Moreover, the breaking load between the wire tail 47 and the connection portion 46 may be further reduced by further reducing the cross-sectional area of the connection portion 46, and the wire tail 47 may be cut by moving the capillary 20 in the horizontal direction.

What is claimed is:

1. A method for manufacturing a semiconductor device in which a first bond point and a second bond point are connected by a wire, the method comprising:
   a preparation step for preparing a wire bonding apparatus which comprises a capillary through which the wire is inserted and a movement mechanism for moving the capillary;
   a ball bonding step in which after a free air ball is formed at a distal end of the wire inserted through the capillary, a distal end of the capillary is lowered to a crimping height, the free air ball is joined to the first bond point, and a crimping ball and a ball neck above the crimping ball are formed;
   a thin-walled portion forming step in which the distal end of the capillary is moved in a horizontal direction, and a thin-walled portion having a reduced cross-sectional area is formed between the ball neck and the crimping ball;
   a wire tail bending step in which after the thin-walled portion is formed, the capillary is reciprocated in an arc shape in the direction to the second bond point, and the wire is bent and deformed;
   a wire tail separating step in which after the capillary is raised to unroll a wire tail, the capillary is moved in a direction to the second bond point, and the wire tail and the crimping ball are separated in the thin-walled portion; and
   a wire tail joining step in which the capillary is lowered and a side surface of the separated wire tail is joined onto the crimping ball.

2. The method for manufacturing a semiconductor device according to claim 1, wherein
   in the thin-walled portion forming step, the capillary is raised to a shear height higher than the crimping height, and the capillary is moved in the horizontal direction.

3. The method for manufacturing a semiconductor device according to claim 1, wherein
   in the thin-walled portion forming step, the capillary is reciprocated in the horizontal direction when forming the thin-walled portion.

4. The method for manufacturing a semiconductor device according to claim 1, wherein
   in the wire tail separating step, when the wire tail is separated from the crimping ball in the thin-walled portion,
   the capillary is moved diagonally upward in the direction toward the second bond point.

5. The method for manufacturing a semiconductor device according to claim 1, wherein
   in the wire tail joining step, when the side surface of the wire tail is joined onto the crimping ball, a face portion of the capillary at the first bond point side is moved to the above of an end portion of the crimping ball opposite to the second bond point, and then the capillary is lowered to join the side surface of the bent and deformed wire tail onto the end portion of the crimping ball opposite to the second bond point by the face portion of the capillary.

* * * * *